United States Patent [19]

Meldrum

[11] 4,319,305

[45] Mar. 9, 1982

[54] PRINTING CIRCUIT BOARD MOUNTING SYSTEMS

[75] Inventor: James S. Meldrum, Strathaven, Scotland

[73] Assignee: Burroughs Corporation, Detroit, Mich.

[21] Appl. No.: 160,359

[22] Filed: Jun. 17, 1980

[30] Foreign Application Priority Data

Jun. 20, 1979 [GB] United Kingdom ............... 21436/79

[51] Int. Cl.³ .............................................. H05K 7/16
[52] U.S. Cl. .................................... 361/415; 361/395; 361/420
[58] Field of Search ................ 361/415, 420, 395, 412

[56] References Cited

U.S. PATENT DOCUMENTS

| | | | |
|---|---|---|---|
| 3,188,424 | 6/1965 | Williams | 361/415 X |
| 3,376,479 | 4/1968 | Wines | 361/395 |
| 3,975,665 | 8/1976 | Holl | 361/415 |
| 4,208,079 | 6/1980 | Prado | 361/415 X |
| 4,230,986 | 10/1980 | Deaver | 361/415 X |

FOREIGN PATENT DOCUMENTS 652746 3/1979 U.S.S.R. ............... 361/412

Primary Examiner—Richard R. Kucia
Attorney, Agent, or Firm—James E. Ledbetter; Howard W. Califano; Kevin R. Peterson

[57] ABSTRACT

A printed circuit board mounting system uses three pairs of channels 7, 11, 14 to support a board 3 in a rest position, a test position or a repair position, for the maintenance of the board 3 without its removal from the equipment of which it is a part.

20 Claims, 3 Drawing Figures

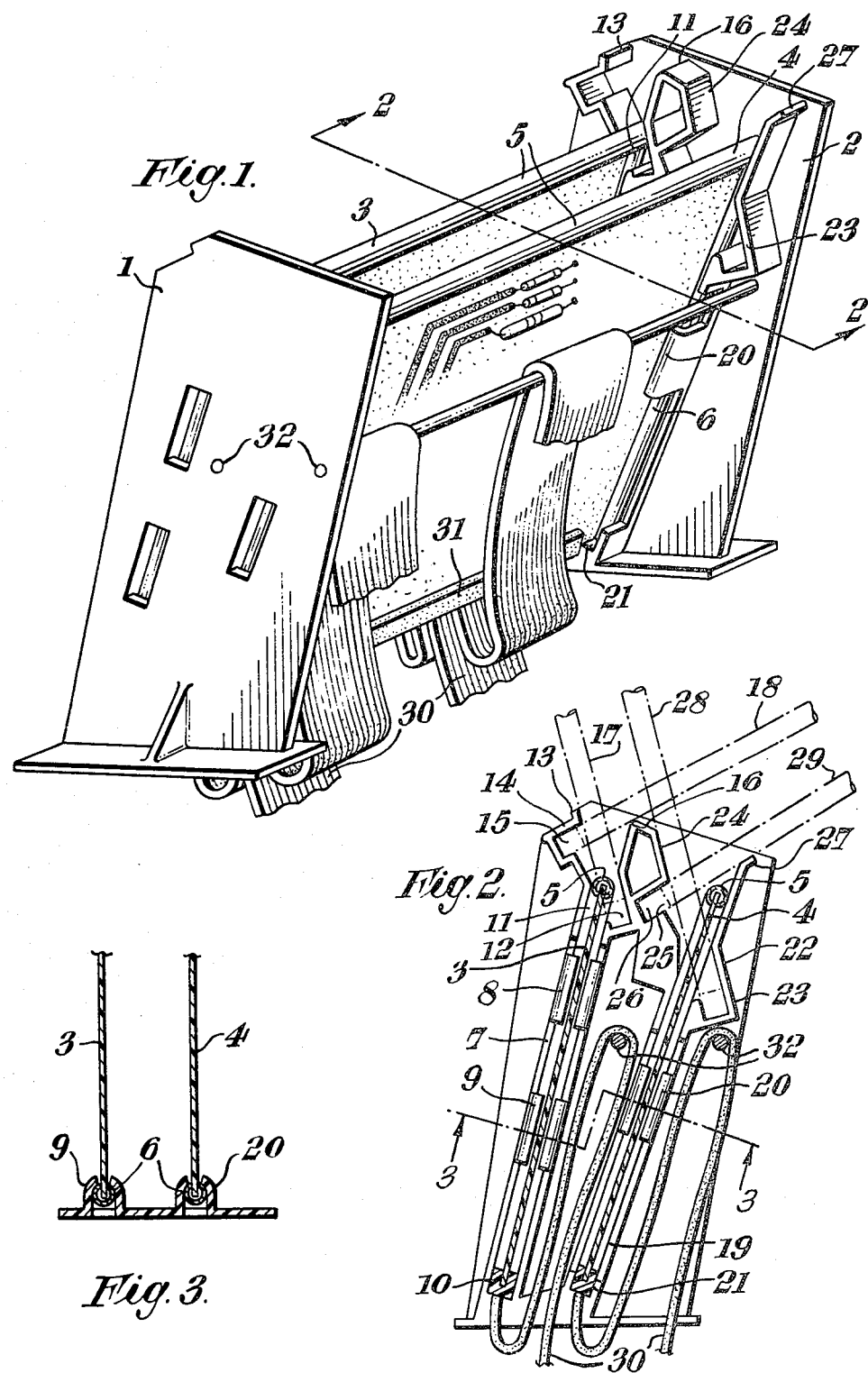

PRINTING CIRCUIT BOARD MOUNTING SYSTEMS

BACKGROUND TO THE INVENTION

1. Field of the Invention

This invention relates to printed circuit board mounting systems and it is an object of the invention to provide a system for mounting one or more printed circuit boards in such a way that the, or each, board can readily be moved from a normal rest position in which neither side of the board is readily accessible, to a test position in which one side of the board is readily accessible, and also to a repair position in which the other side of the board is readily accessible.

2. The Prior Art

The use of extender cards and other such aids is well known in the test and repair of printed circuit boards. These are undesirable from the aspect of maintenance of constant circuit conditions. The physical removal of boards is time wasting. Inaccessibility of boards is a major contributor to repair or maintenance time in electronic equipment. Accordingly, it is desirable to provide a method for mounting a plurality of printed circuit boards for ease of access for maintenance purposes.

SUMMARY OF THE INVENTION

The present invention consists in a printed circuit board mounting system comprising a first pair of channels for each board to be mounted, said first pair of channels being adapted to engage portions of two opposite sides of the board and to support the board in a first position, a second pair of channels for each board to be mounted, said second pair of channels communicating with said first pair of channels and being adapted to engage portions of said sides and to support the board in a second position, and a third pair of channels for each board to be mounted, said third pair of channels communicating with said first pair of channels and being adapted to engage portions of said sides and to support the board in a third position.

It is to be understood that, when the board is in the first position, both sides of the board will normally be inaccessible, whereas, when the board is in the second position, the front of the board will be readily accessible, while, when the board is in the third position, the back of the board will be readily accessible.

Normally the axes of the first pair of channels will be vertical or inclined at a small angle to the vertical, while the axes of the second and third pairs of channels will be substantially horizontal or inclined to the horizontal at a small angle.

In one form of the invention, each set of three channels has a generally T-shaped configuration. In this case, the axis of the first channel is substantially vertical and the axes of the second and third channels are substantially horizontal, said second and third channels extending in opposite directions from the top of the first channel. In fact, in all practical cases, both the second and third channels will slope downwardly from the top of the first channel.

It will be understood that the board normally rests in the first pair of channels but, when it is to be tested, it can be slid upwardly in the first channel until the bottom of the board reaches the entrances of the second pair of channels. The board is then slid into the second pair of channels and is supported thereby while the tests are carried out. Under these conditions, one side of the board will be readily accessible. If desired, the tops of the third pair of channels may be designed to assist in supporting the board while it is in the second position. If it is necessary to remove a component from the board, the board can be slid out of the second pair of channels, turned over and then slid into the third pair of channels so that the opposite side of the board is accessible.

It is, of course, to be understood that connections are made to the board by means of flexible connectors, preferably terminating in rigid connection blocks adapted to receive the bottom edge of the board.

In a preferred form of the invention, each printed circuit board is provided with rigid members along the two sides of the board, and the top edge of the board. These rigid members may be tubular or solid cylindrical members, for example, consisting of aluminium having an axially extending slot to receive the board. Thus the board penetrates each cylinder along a diameter of the cylinder.

Preferably each cylinder member is mitred where it meets an adjacent member at right-angles. It is to be understood that these rigid members prevent the board from flexing. In particular, in the case of a rectangular board in which the length of the two sides is less than the length of the top and bottom of the board, the cylindrical member extending along the top of the board provides the required rigidity. The two members fixed to the sides of the board serve as bearing members which slide in the associated channel members. In addition to providing rigidity, the cylindrical member along the top edge of the board serves as a handle for lifting the board when it is moved from the first position to the second or third positions.

It is to be understood that normally a plurality of printed circuit boards will be mounted side by side. In this case, the channels are preferably provided in synthetic resin mouldings which constitute end panels of a mounting frame. It is to be understood that the arrangement of the channels in the side panels must be such that any board can be placed into either the second or third position without fouling the other boards while they are in the first position.

From another aspect the invention consists in any features of novelty, taken singly or in combination, of the printed circuit board mounting system illustrated in the accompanying diagrammatic drawings, in which:

BRIEF DESCRIPTION OF THE DRAWINGS

FIG. 1 is a perspective view of one embodiment of the invention;

FIG. 2 is a cross-sectional view on the line 2:2 of the embodiment illustrated in FIG. 1 looking in the direction of the arrows; and FIG. 3 is a cross-sectional view of a part of the embodiment illustrated in FIG. 2 taken on the line 3:3 looking in the direction of the arrows.

The system illustrated in the drawings includes two end panels 1 and 2 which are moulded from a synthetic resin material. Each of the panels includes an outer flat portion from which a plurality of raised portions project inwardly. These raised portions define the sets of channels in accordance with the present invention.

DETAILED DESCRIPTION OF THE PREFERRED EMBODIMENT

FIG. 1 shows two printed circuit boards 3 and 4 in position in the mounting system. The two boards are shown in their rest positions for normal operation. Each of the boards is provided with three solid cylindrical edge members, one of which, indicated by the reference numeral 5, extends along the top of the board and serves not only to give the board rigidity, but also to act as a handle for moving the board. The members on the sides of the board, two of which can best be seen in FIG. 3 as indicated by the reference numeral 6, serve primarily as bearings which are slidable in the channels formed by the panel mouldings.

The printed circuit board 3 normally rests in a pair of channels 7 which include portions 8 and 9 which embrace the members 6 apart from a small gap through which the printed circuit board passes. In addition, each channel includes a lower stop member 10 on which the bottom edge of the printed circuit board rests.

In communication with each of the channels 7 is a further channel 11 which is constituted primarily by an L-shaped portion 12 at the foot of the channel, and a supporting portion 13 at the top of the channel. The third channel 14 is constituted primarily by a lower L-shaped portion 15 and a supporting portion 16. The cylindrical member 6 on one side of the printed circuit board 3 is shown in the channel 11 in dash-dotted lines at 17 in FIG. 2, and in the third channel 14 in dash-dotted lines at 18.

The printed circuit board 4 is normally supported in a pair of channels 19 which include a portion 20 which embraces the member 6 apart from a small gap through which the printed circuit board passes. In addition, each channel includes a lower stop member 21 on which the bottom edge of the printed circuit board rests.

In communication with each of the channels 19 is a further channel 22 which is constituted primarily by an L-shaped portion 23 at the foot of the channel, and a supporting member 24 at the top of the channel. The third channel 25 is constituted primarily by a lower L-shaped portion 26 and a supporting portion 27. The cylindrical member 6 at one side of the printed circuit board 4 is shown in the channel 22 in dash-dotted lines at 28 in FIG. 2, and the third channel 25 in dash-dotted lines at 29.

Electrical connections to the printed circuit boards are made via harnesses 30 and edge connectors, one of which is shown at 31. The drawing shows a single continuous edge connector which serves to impart additional rigidity to the board. However, it is to be understood that the single connector shown may be replaced by a plurality of relatively short connectors if desired. Each of the harnesses 30 passes around a bar 32 extending between two end panels 1 and 2. This arrangement provides for accommodation of the excess harness required for raising the printed circuit towards the second or third positions. The ends of the harnesses which are shown free may be fitted with rigid connectors which can be plugged into appropriate sockets on the frame of the machine, or connected to the adjacent board.

What I claim is:

1. A printed circuit board mounting system comprising a first pair of channels for each board to be mounted, said first pair of channels being adapted to engage portions of two opposite sides of the board and to support the board in a first position, a second pair of channels for each board to be mounted, said second pair of channels communicating with said first pair of channels and being adapted to engage portions of said sides and to support the board in a second position, and a third pair of channels for each board to be mounted, said third pair of channels communicating with said first pair of channels and being adapted to engage portions of said sides and to support the board in a third position.

2. A system according to claim 1 adapted to support a plurality of boards, in said first position, substantially parallel-planarly to one another.

3. A system according to claim 1 or claim 2 comprising side strengthening means for attachment to said sides and adapted to reduce the flexure of a board.

4. A system according to claim 3, wherein said side strengthening means comprises a pair of cylindrical edge members attached to said sides such that the board penetrates them along at least part of the length of a diameter, and wherein said first, second and third channels have walls of part-circular cross section for accommodating said cylindrical edge members.

5. A system according to claim 4, wherein said transverse strengthening member comprises at least one cylindrical edge members for attachment to at least one of the two opposite sides of a board which do not engage with said channels such that the board penetrates said transverse strengthening member along at least part of the length of a diameter.

6. A system according to claim 1 comprising transverse strengthening means for attachment to a board between said sides and adapted to reduce the flexure of the board.

7. A system according to claim 1 adapted such that the insertion of a board into said second board channels does not necessitate the total withdrawal of the board from said first pair of channels.

8. A system according to claim 1 adapted such that the insertion of a board into said third pair of channels does not necessitate the total withdrawal of the board from said first pair of channels.

9. A system according to claim 1 wherein the opening to said first pair of channels is adapted to assist said second pair of channels in supporting a board.

10. A system according to claim 1 wherein the opening to said second pair of channels is adapted to assist said third pair of channels in supporting a board.

11. A system according to claim 1 wherein, when a board is in said second position it is substantially withdrawn from said first pair of channels with substantially the whole of a first surface of the board exposed for access from a predetermined direction.

12. A system according to claim 1 wherein said second pair of channels communicates with said first pair of channels from a first side of said first pair of channels and said third pair of channels communicates with said first pair of channels from a second side of said first pair of channels.

13. A system according to claim 12 wherein, when a board is in said third position it is substantially withdrawn from said first pair of channels with substantially the whole of a second surface of the board exposed for access from said predetermined direction.

14. A system according to claim 13 further adapted to support a plurality of boards in said first position, substantially parallel-planarly to one another, wherein any one of said plurality of boards can be placed in said second position without the movement of any other out of said plurality of boards from their first positions.

15. A system according to claim 14 wherein any one of said plurality of boards can be placed in said third position without the movement of any other out of said plurality of boards from their first positions.

16. A system according to claim 1 comprising flexible connection means for providing electrical connection to a board independently of whether the board is in said first, second or third positions.

17. A system according to claim 16 wherein said flexible connection means comprises at least one flexible connector for plugging into a board.

18. A system according to claim 1 wherein said first, second and third pairs of channels are incorporated in a pair of end panels.

19. A system according to claim 18 wherein said end panels are moulded in a synthetic resin material.

20. A system according to claim 1 wherein said first, second and third pairs of channels are defined by discontinuous walls.

* * * * *